United States Patent
Bossart et al.

(10) Patent No.: US 10,359,738 B2
(45) Date of Patent: Jul. 23, 2019

(54) PROCESS FOR MANUFACTURING A HYBRID TIMEPIECE COMPONENT

(71) Applicant: ROLEX SA, Geneva (CH)

(72) Inventors: Richard Bossart, Attalens (CH); Florian Calame, Epalinges (CH)

(73) Assignee: ROLEX SA, Geneva (CH)

( * ) Notice: Subject to any disclaimer, the term of this patent is extended or adjusted under 35 U.S.C. 154(b) by 127 days.

(21) Appl. No.: 15/417,854

(22) Filed: Jan. 27, 2017

(65) Prior Publication Data

US 2017/0220004 A1 Aug. 3, 2017

(30) Foreign Application Priority Data

Feb. 3, 2016 (EP) ..................... 16154126

(51) Int. Cl.
*G04B 13/02* (2006.01)
*G04B 31/06* (2006.01)
*G04B 1/14* (2006.01)
*B81C 99/00* (2010.01)
*G04B 15/14* (2006.01)
(Continued)

(52) U.S. Cl.
CPC .......... *G04B 31/06* (2013.01); *B81C 99/0085* (2013.01); *G04B 1/145* (2013.01); *G04B 13/02* (2013.01); *G04B 15/14* (2013.01); *G04B 17/063* (2013.01); *G04B 17/066* (2013.01); *G04B 18/08* (2013.01); *G04B 19/042* (2013.01); *G04B 19/044* (2013.01); *B81B 2201/035* (2013.01); *B81C 2201/034* (2013.01)

(58) Field of Classification Search
CPC ...... G04B 31/06; G04B 19/044; G04B 18/08; G04B 17/066; G04B 17/063; G04B 15/14; G04B 19/042; G04B 13/02; G04B 1/145; B81C 99/0085; B81C 2201/034; B81B 2201/035

See application file for complete search history.

(56) References Cited

U.S. PATENT DOCUMENTS

2010/0243603 A1* 9/2010 Fiaccabrino ........ B81C 99/0095
216/53
2017/0362728 A1* 12/2017 Abe ....................... G04B 15/14

FOREIGN PATENT DOCUMENTS

CH 706 645 A1 12/2013
EP 1 932 804 A2 6/2008
(Continued)

OTHER PUBLICATIONS

European Search Report and Written Opinion dated Jul. 8, 2016 issued in counterpart application No. EP16154126; w/English partial translation and partial machine translation (12 pages).

*Primary Examiner* — Jun S Yoo
(74) *Attorney, Agent, or Firm* — Westerman, Hattori, Daniels & Adrian, LLP

(57) ABSTRACT

Process for manufacturing a hybrid timepiece component, comprising structuring at least one wafer (14) of a first micromachinable material so as to form at least one through-opening (15) within the wafer (14), said structured wafer (14) being intended to form a first part (4) of the hybrid timepiece component; and depositing a metal by electroforming, so that the metal extends through the through-opening (15) and over the two upper and lower faces of the wafer (14) as a single piece resulting from one and the same electroforming step, the electroformed metal being intended to form a second part (8) of the hybrid timepiece component.

14 Claims, 6 Drawing Sheets

(51) Int. Cl.
  *G04B 17/06* (2006.01)
  *G04B 18/08* (2006.01)
  *G04B 19/04* (2006.01)

(56) References Cited

FOREIGN PATENT DOCUMENTS

| | | |
|---|---|---|
| JP | 2012-167808 A | 9/2012 |
| WO | 2009/062943 A1 | 5/2009 |

* cited by examiner

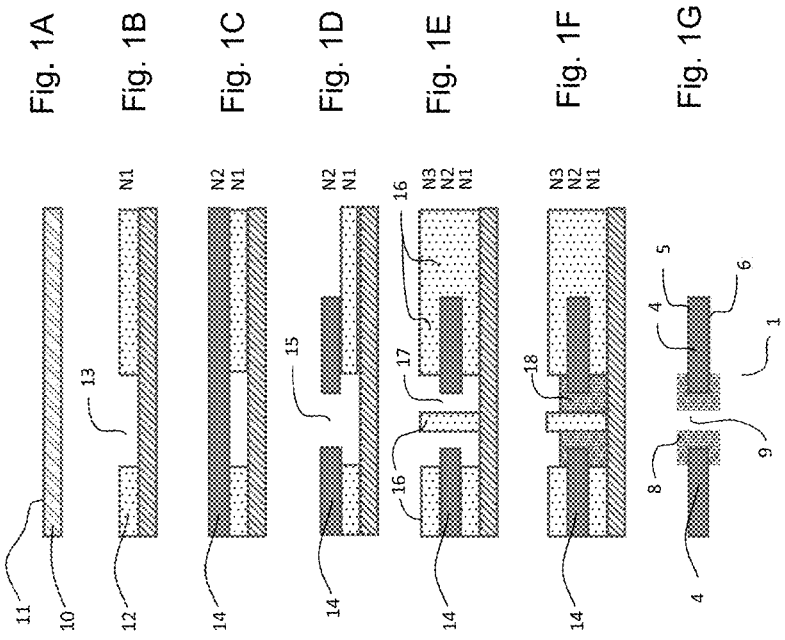

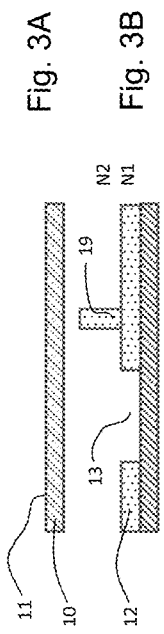
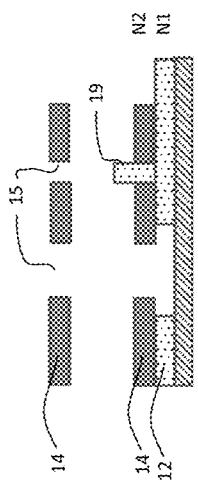
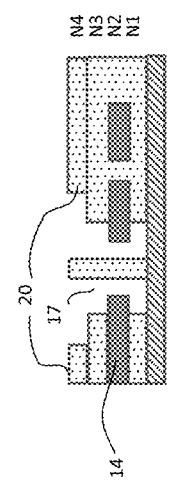
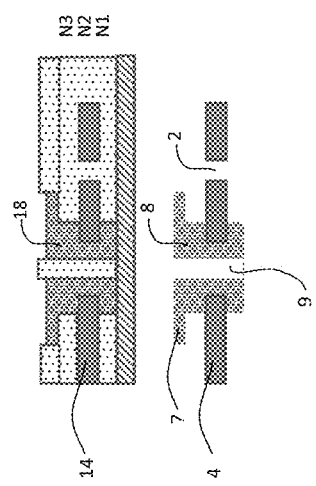

PROCESS FOR MANUFACTURING A HYBRID TIMEPIECE COMPONENT

This application claims priority of European patent application No. EP16154126.3 filed Feb. 3, 2016, whose contents are hereby incorporated herein by reference in their entirety.

BACKGROUND ART

The present invention relates to a process for manufacturing a hybrid timepiece component, comprising at least two different materials. It also relates to a timepiece component as such obtained according to this process, a timepiece movement and a timepiece comprising such a hybrid timepiece component.

It is known to manufacture hybrid timepiece components composed, for example, of a first part made of silicon, or more generally made of any micromachinable material, and of a second part made of metal. One process for manufacturing such a hybrid timepiece component uses a first process for manufacturing by micromachining, in particular by deep reactive-ion etching (DRIE), in order to form the first part, and a second manufacturing process based on electroforming, in particular known under the acronym LIGA, in order to grow the second part made of metal. This second metal part may be added a posteriori but it is more accurate to grow it directly in combination with the first part made of silicon.

Document EP 1 932 804 describes, for example, a method for manufacturing such an hybrid timepiece component that comprises the etching of a silicon wafer placed on a working substrate, on which a layer of photoresist will then be deposited, forming a mold for the growth of an electroformed metal layer. The silicon wafer comprises at least one through-cavity which is also filled in by the electroformed metal. This technique provides the advantage of guaranteeing the precision of positioning of the two different materials of the timepiece component. The result of this is therefore a timepiece component which comprises a first level partially made of silicon and partially made of metal and a second level made of metal, superposed on the upper surface of the first level. An "intimate" bond between the two different materials of the component obtained is ensured by the growth of the metal part along the sides of the silicon, at the through-cavity of the first level. However, this bond is neither a chemical bond nor mechanically strong, since it is only based on the roughness alone of these sides, which may prove too weak to ensure the cohesion of the assembly when it is subjected to certain stresses or to a large temperature variation. Thus, the timepiece components thus obtained exhibit a risk of cohesive failure between the two materials, that is to say at the bond between the metal and silicon.

In order to overcome these drawbacks, document WO 2009/062943 describes a process for manufacturing a silicon-metal hybrid component, wherein the metal part sandwiches the silicon part. For this, the manufacturing process carries out two separate steps of growth of the metal part, respectively on each upper and lower surface of the silicon part. This approach improves the cohesion between the two parts of the timepiece component made of different materials. However, it requires the use of a complex manufacturing process, in particular due to the obligation to turn over the substrate in order to carry out the growth on the lower surface of the silicon part. In addition, a weakness is furthermore observed at the interface between the various separate layers of metal formed by the two separate steps of growth of the metal part.

SUMMARY OF THE INVENTION

Thus, the objective of the present invention is to improve the manufacture of a hybrid timepiece component. In particular, this invention applies to the manufacture of any timepiece component comprising a first part in a first material, preferably a micromachinable material, and a second part in a different second material, made of metal.

More specifically, a first objective of the invention is to make it possible to achieve a satisfactory cohesion and a satisfactory mechanical strength of a hybrid timepiece component.

A second objective of the invention is to propose a simple process for manufacturing a hybrid timepiece component.

For this purpose, the invention relates to a process for manufacturing a hybrid timepiece component, wherein the following steps are comprised:

structuring at least one wafer of a first micromachinable material so as to form at least one through-opening within the wafer, said structured wafer being intended to form a first part of the hybrid timepiece component;

depositing a metal by electroforming, so that the metal extends through the through-opening and over the two upper and lower faces of the wafer as a single piece resulting from one and the same electroforming step, the electroformed metal being intended to form a second part of the hybrid timepiece component.

The invention also relates to a hybrid timepiece component comprising a first part made of a first micromachinable material, wherein a second part made of metal material different from the first material is comprised, this second part extending continuously as a single piece over the upper surface of the first part, through a through-opening of the first part then over the lower surface of said first part, so that the first part is framed on either side by the second part, which guarantees the mechanical holding between the two parts.

The invention is more particularly defined by the claims.

BRIEF DESCRIPTION OF THE DRAWINGS

These objectives, features and advantages of the present invention will be disclosed in detail in the following description of particular embodiments given non-limitingly in connection with the appended figures, among which:

FIGS. 1A to 1G illustrate the successive steps of a process for manufacturing a hybrid timepiece component according to one embodiment of the invention.

FIGS. 3A to 3G illustrate the successive steps of a process for manufacturing a hybrid timepiece component according to a second variant of the embodiment of the invention.

DETAILED DESCRIPTION OF PARTICULAR EMBODIMENTS

Figures 2A, 2B, 2C, 2D, 2E, 2F, 2G:
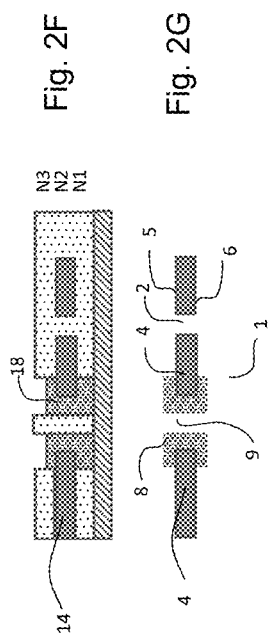
FIGS. 2A to 2G illustrate the successive steps of a process for manufacturing a hybrid timepiece component according to a variant of the embodiment of the invention.

For the sake of simplification, the term "metal" will be used in the following description to denote a metallic material or a metal alloy. Furthermore, the same references will be used for identical or similar elements in the various embodiment variants of the invention.

FIG. 1A illustrates a first step of the process for manufacturing a hybrid timepiece component according to the embodiment of the invention. This step consists in being provided with a working substrate 10 that will act as support for the fabrication of the timepiece component. This substrate is intended to be removed, that is to say that it is not part of the final timepiece component. It is either made of metal or made of any conductive material, or formed using a nonconductive material, the upper surface 11 of which is rendered conductive by metallization. Thus, the working substrate may consist of a silicon wafer comprising a metal layer obtained by PVD deposition or by electroforming, or of a doped silicon wafer or of a metal wafer or of any other flat substrate, the upper surface of which conducts the electric current.

The construction of the timepiece component will be carried out using a stack of layers in a direction substantially perpendicular to the upper surface 11 of the substrate 10, that will be referred to, by convention, as the vertical direction z, oriented upward in the figures. This flat substrate 10 likewise defines, by convention, a horizontal plane.

FIG. 1B illustrates the second step of the process for manufacturing a hybrid timepiece component that consists in depositing and structuring a first layer 12 of photosensitive resin in order to form the lower part of the mold intended to control the lower growth of the metal part of the hybrid timepiece component.

In a known manner, the resin is a photoresist, suitable for photolithography. The photoresist may be negative or positive. In the first case, it is designed to become insoluble to, or difficult to dissolve by, a developer under the action of a radiation whilst in the second case, it is designed to become soluble to a developer under the action of a radiation, whilst the part not exposed to the radiation remains insoluble or difficult to dissolve. In the particular example of the embodiment, the resist used may be of "SU-8" type, which is a negative photoresist that polymerises under the action of UV radiation. A step of photolithography of the initial photoresist layer is carried out, which consists in exposing the initial resist layer to light radiation, or insolating it through a mask comprising openings and opaque zones. This mask defines the pattern to be reproduced for the production of the first level of the component to be manufactured. The light radiation used for irradiating or insolating the resist is here UV radiation emitted by a UV source. The radiation is perpendicular to the plane in which the mask extends so as to irradiate only the zones of the resist located at the openings made in the mask. In the particular exemplary embodiment described here, the insolated resist zones become insensitive or insoluble to most developing liquids. The preceding step of exposure to light radiation is optionally followed by a crosslinking heat treatment step, then by a development step. The development consists in removing the unexposed resist zones according to a process adapted to the resist used, for example by dissolving with a chemical or by a plasma process. After dissolving, the conductive upper surface 11 of the substrate 10 appears at least over a zone of the mold 13 where the resist has been removed. Any other method of the prior art that makes it possible to form a mold may, as a variant, be used.

At the end of this step, the mold 13 and the structure illustrated by FIG. 1B, in which the conductive upper surface 11 of the substrate 10 is covered by a resist mold 13 on a layer forming a first level N1, are thus obtained.

Advantageously, the first photoresist layer has a thickness (height in the z direction by convention) identical to the thickness desired for the lower part of the metal part of the hybrid timepiece component.

The next step, illustrated by FIG. 1C, consists in depositing, on this first photoresist layer 12 forming the mold 13 on the level N1, a silicon wafer 14, forming a second level N2 of the structure superposed on the level N1. This silicon wafer 14 is intended to form a first part made of a first material of the final hybrid timepiece component.

Next, the process carries out a step of structuring the silicon wafer 14, by DRIE etching for example, so as to form at least one through-opening 15 at least partially superposed on a resist-free zone 13 of the first level N1. As an observation, the upper surface 11 of the substrate 10 therefore remains accessible via this at least one through-opening 15 of the silicon wafer. FIG. 1D illustrates the result obtained by this step. As an observation, the through-opening 15 is ideally smaller in at least one given direction than the material-free zone on top of which it is formed, in order to favour the cohesion of the final component that will be formed, as will be specified subsequently. In other words, the lower surface of the wafer 14 covers at least a part of a resist-free zone 13 of the first level N1.

The process then carries out a step that consists in depositing and structuring a second photoresist layer 16, forming a third level N3 on top of the upper surface of the silicon wafer 14 and optionally filling at least a part of at least one through-opening 15 of the wafer 14. FIG. 1E illustrates an example of a result obtained by this step, which consists in forming a mold 17, therefore extending partly, on the level N3, over the upper surface of the silicon wafer 14, and partly (optionally) inside the through-openings 15 of the silicon wafer, to the upper surface 11 of the substrate. This mold 17 is therefore formed by the combination of the mold 13 of the level N1, the through-opening 15 of the level N2 and an at least partly superposed material-free zone of the level N3. It extends from the upper surface 11 of the substrate 10 to the upper surface of the level N3. In the example illustrated, the through-opening 15 is cylindrical, and the layer 16 has a cylindrical part of smaller diameter positioned in the center of the cylinder formed by the through-opening 15, leaving an empty ring around its circumference forming an annular part of the mold 17. At the level N3, the mold 16 ideally leaves at least one surface of the wafer 14 visible at a through-opening 15, directly on an access of this through-opening 15.

The process then carries out a step that consists in electrodepositing a metal in the mold formed by the various layers of photoresist and the silicon part of the hybrid timepiece component. This growth of metal, intended to form a second part made of a second material of the final hybrid timepiece component, is continued at least partly over the level N3. The result is illustrated in FIG. 1F. It therefore appears that the electroformed metal 18 forms a part as a single piece that extends from the upper surface 11 of the substrate 10 to the layer of level N3, on top of the silicon wafer. The metal extends in particular both over the lower surface and over the upper surface of the wafer 14, while passing through it via a through-opening 15, which forms a sandwich structure with the aid of a metal part as a single piece formed by one and the same electroforming step. The timepiece component therefore comprises a first layer on a first level N1 that comprises only metal, a second layer on a second level N2 that comprises metal and silicon, and a third layer on a third level N3 that comprises only metal.

Finally, the process carries out a last step of releasing the hybrid timepiece component from its support, that is to say the substrate 10, which makes it possible to obtain the hybrid timepiece component 1 illustrated by FIG. 1G, formed by a silicon part 4 originating from the silicon wafer 14 used and a metal part 8 originating from the electroformed metal 18. In addition, the resists used were eliminated, in a known manner, before or after the removal of the substrate 10.

The invention also relates to such an hybrid timepiece component obtained by this manufacturing process. Such a component therefore comprises a first part 4 in a first material, for example silicon or any other micromachinable material, and a second part made of metal. This second part 8 forms a continuous zone that extends over the upper surface 5 of the first part 4, crosses the first part 4 over its entire thickness then extends over the lower surface 6 of said first part 4. The result of this is that the first part 4 is trapped between two portions of the second part 8, which guarantees the mechanical holding between the two parts. Moreover, the second part 8 is obtained as a single piece, which guarantees its maximum strength while enabling the simple formation thereof by a single electroforming step. According to the embodiment illustrated, the timepiece component furthermore comprises a cylindrical through-opening 9 within the second part 8, which makes it possible to insert a rotating shaft for example, or to form a metal insert for driving in the hybrid timepiece component.

The first part of the hybrid timepiece component may be made of any micromachinable material such as for example silicon, diamond, quartz or a ceramic. As a variant, the micromachinable material used may consist of two or more layers, or of several wafers superposed on one another such as for example an "SOI" silicon wafer.

Furthermore, the hybrid timepiece component may comprise more than two parts, at least a third part made of a third material different from the two materials, which may be a micromachinable material or an electroformed metal, joined to the architecture in a manner similar to the first two materials.

FIGS. 2A to 2F illustrate an embodiment variant, in which only the differences will be explained.

According to this variant of the process, the second step of forming a mold 13 of level N1 is followed by the creation of a second resist layer 19 of level N2, directly superposed on level N1, in order to achieve the result illustrated by FIG. 2B. This second layer 19 advantageously makes it possible to produce positioning pins.

Next, and as illustrated by FIG. 2C, the silicon wafer 14 is structured independently, for example by a DRIE method, in order to form through-openings 15, including at least one corresponding to a positioning pin and at least one intended to be superposed on a resist-free zone 13 of the mold of first level N1. As an observation, this structured wafer may undergo other treatments, such as a treatment by oxidation, by doping or by any other technique (nitriding, annealing, with ALD or CVD layer) aiming to give it the required properties. The structured wafer is then joined to the previously formed structure as illustrated in FIG. 2C, so that a through-opening is passed through by a positioning pin. This architecture guarantees a precise positioning of the silicon wafer on the level N2, as represented by FIG. 2D, in particular a good alignment and a precise superposition of its through-opening(s) 15 on top of a material-free zone 13 of the first level N1. As an observation, the silicon wafer 14 is thus held by the resist, both vertically by the first resist layer of level N1 and horizontally by at least one resist positioning pin formed by the layer 19. Naturally, it is also possible, as an option, to add additional structurings (treatment, micromachining) to the silicon wafer 14 after its positioning on the level N2 of the previous architecture.

The next steps, illustrated by FIGS. 2E to 2G, correspond respectively to the steps illustrated by FIGS. 1E to 1G described previously.

The hybrid timepiece component obtained, represented by FIG. 2G, is very similar to that illustrated by FIG. 1g. It furthermore comprises a through-opening 2 formed solely in the first part 4.

The manufacturing process described by the two preceding embodiment variants may comprise other embodiment variants.

For example, the process may comprise an intermediate metallization step between two steps described previously, so as to form an electrically conductive layer on the non-conductive resist and/or silicon surfaces, in order to ensure a correct deposition of the metal, for example on the shoulders.

According to another variant, there may be multiple photoresist deposition and structuring steps within one and the same step, in order to create molds of more complex shape and ultimately a component of more complex structure.

As a variant, it is possible to add one or more other resist layers in order to obtain a more complex structure.

For this purpose, FIGS. 3A to 3G illustrate a second embodiment variant of the manufacturing process, in which only the differences will be explained.

The first steps relating to FIGS. 3A to 3D correspond to the steps relating to FIGS. 2A to 2D of the variant described previously.

Next, the process comprises the positioning and structuring of a resist layer 16 on a level N3, then the positioning and structuring of an additional resist layer 20 on a level N4, forming a mold 17 that extends over four levels N1 to N4 instead of three in the preceding variant.

The following electrodeposition step, the result of which is illustrated by FIG. 3F, is similar to that carried out with reference to FIG. 2F, but on an additional level N4.

The hybrid timepiece component obtained, represented by FIG. 3G, differs from the preceding components in that it comprises a metal structure 7, for example of wheel type, not in direct contact with the silicon part 4 of the timepiece component, while being totally cohesive. This second variant thus enables a division of the two parts of the timepiece component (for example silicon/metal wheel).

It is obviously also possible to structure the first resist layer directly deposited on the substrate of the embodiments as two (or more) separate layers, in an analogous manner.

The manufacturing process described previously may be used for the manufacture of timepiece components such as, as illustrative and nonlimiting examples, a pallet, a jumper, a wheel, a pinion, a rack, a spring, a balance, a cam, or else a bar.

The invention also relates to a hybrid timepiece component obtained by the process described previously, and also to a timepiece movement and a timepiece, for example a wristwatch, comprising such a hybrid timepiece component.

Figure 4B:
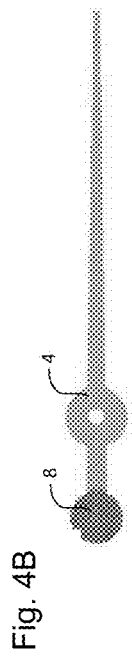
FIGS. 4A, 4B, 5A, 5B, 6, 7A to 7C, 8A to 8D, and 9 illustrate various hybrid timepiece components according to the embodiment of the invention.
Figure 4A:
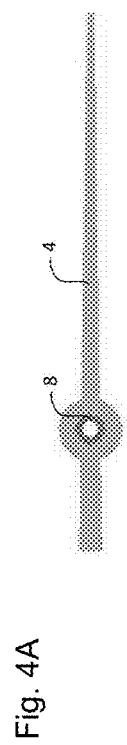

The latter may be a hand with metal insert for driving in, as represented by FIG. 4A, or a hand with counterweight for balancing, as represented by FIG. 4B.

Figure 5B:
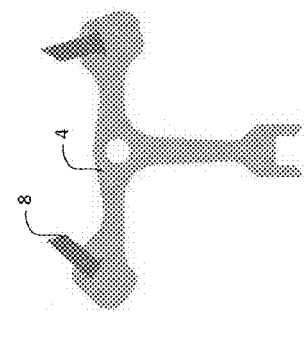
Figure 5A:
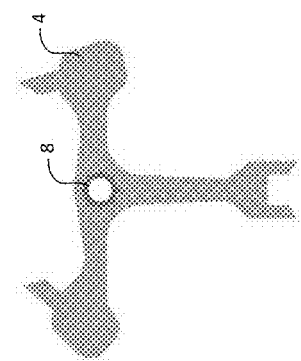

The hybrid timepiece component may be a pallet with metal insert for driving in, as represented by FIG. 5A, or a pallet with metal pallet stones, as represented by FIG. 5B.

Figure 6:
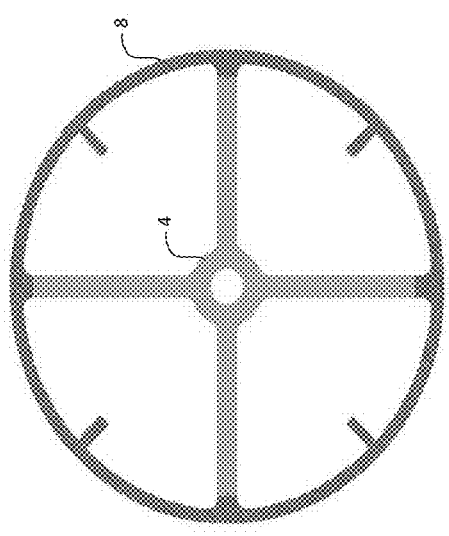

The hybrid timepiece component may be a balance with an optimized inertia/weight ratio as represented by FIG. 6.

Figure 7A:
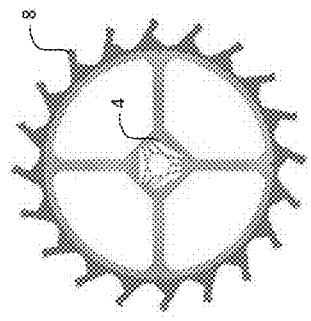
Figure 7C:
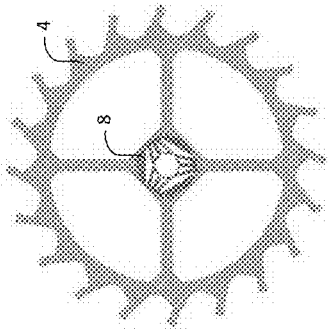
Figure 7B:
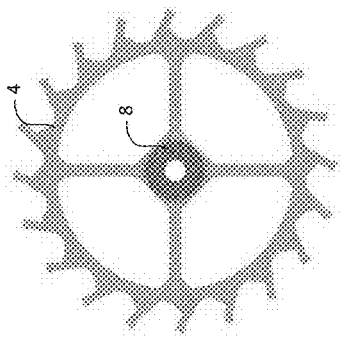

The hybrid timepiece component may be a pallet wheel with metal teeth as represented by FIG. 7A, a pallet wheel with metal inserts as represented by FIG. 7B, or a pallet wheel with flexible metal structure as represented by FIG. 7C.

Figure 8B:
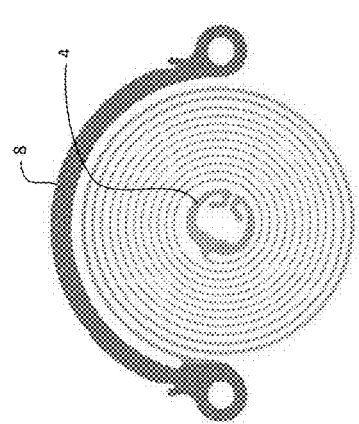
Figure 8A:
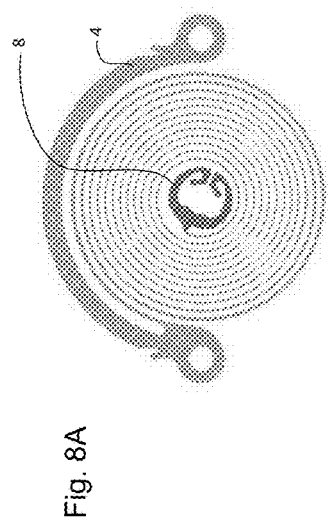
Figure 8D:
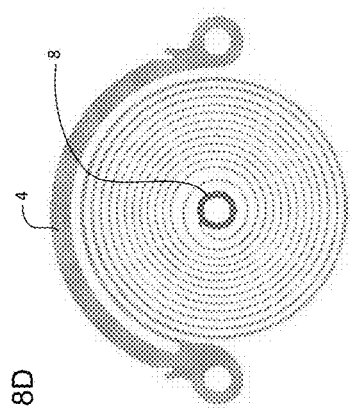
Figure 8C:
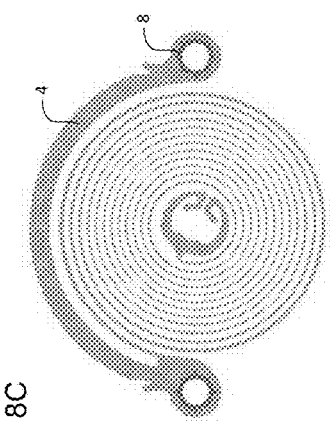

The hybrid timepiece component may be a balance spring with flexible metal collet as represented by FIG. 8A, a balance spring with a metal balance spring support which is provided to enable the fastening of the outer end of the balance spring or a metal pinning up to the stud system, as represented by FIG. 8B, a balance spring with metal inserts for driving in on the balance spring support as represented by FIG. 8C, a balance spring with metal insert for driving in to the collet as represented by FIG. 8D. The manufacture of such a balance spring uses the variant of the manufacturing process described previously, carrying out a prior and independent structuring of an oxidized silicon wafer, in particular in order to form the coils that are advantageously made from oxidized silicon in order to give them the optimum performances.

Figure 9:
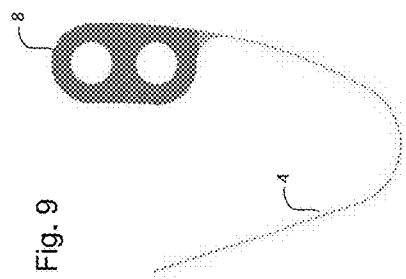

The hybrid timepiece component may be a spring with the functional part made of silicon and the attachment part made of metal as represented by FIG. 9.

The invention claimed is:

1. A process for manufacturing a hybrid timepiece component, comprising:
    providing a substrate, at least an upper surface of which is conductive;
    forming a first resist mold on top of the upper surface of the substrate, the first resist mold comprising at least one material-free zone on top of the substrate;
    structuring at least one wafer of a first micromachinable material and depositing the at least one wafer on top of the first resist mold or conversely positioning at least one wafer of a first micromachinable material on top of the first resist mold and structuring the at least one wafer so as to form at least one through-opening of the at least one wafer at least partially superposed on a material-free zone of the first resist mold, the structured wafer being intended to form a first part of the hybrid timepiece component;
    forming a second resist mold on top of the wafer, comprising material-free zones that extend from the upper surface of the substrate to the upper surface of the stack;
    depositing a metal or an alloy by electroforming, so that the metal extends from the upper surface of the substrate to the top of the wafer through the through-opening and over the two upper and lower faces of the wafer as a single piece resulting from one and the same electroforming, the electroformed metal being intended to form a second part of the hybrid timepiece component; and
    releasing the hybrid timepiece component by the removal of the substrate.

2. The process for manufacturing a hybrid timepiece component as claimed in claim 1, additionally comprising:
    forming at least one through-opening in the at least one wafer superposed on a material-free zone of the first resist mold so that the lower face of the wafer at least partially covers the material-free zone of the first resist mold; and
    forming the second resist mold on top of the wafer which leaves free at least a part of the upper surface of the wafer at a through-opening of the wafer.

3. The process for manufacturing a hybrid timepiece component as claimed in claim 1, comprising:
    forming a second resist layer on top of the first resist mold formed on top of the upper surface of the substrate, the second layer forming at least one positioning pin that enables the subsequent positioning of a structured wafer, a through-opening of which engages with a positioning pin in order to ensure the horizontal holding thereof.

4. The process for manufacturing a hybrid timepiece component as claimed in claim 1, wherein the substrate consists of a silicon wafer comprising a metal layer.

5. The process for manufacturing a hybrid timepiece component as claimed in claim 1, wherein the forming of the first resist mold on top of the upper surface of the substrate forms the first resist mold, the thickness of which corresponds to the height of metal positioned on the lower face of the first part of the hybrid timepiece component.

6. The process for manufacturing a hybrid timepiece component as claimed in claim 1, wherein the timepiece component is selected from the group consisting of a hand, a pallet, a balance, a pinion, a pallet wheel, a balance spring, and a spring.

7. The process for manufacturing a hybrid timepiece component as claimed in claim 1, wherein the forming a second resist mold on top of the wafer, comprising material-free zones that extend from the upper surface of the substrate to the upper surface of the stack.

8. The process for manufacturing a hybrid timepiece component as claimed in claim 4, wherein the silicon wafer comprising a metal layer is obtained by PVD deposition or by electroforming.

9. The process for manufacturing a hybrid timepiece component as claimed in claim 1, wherein the substrate consists of a doped silicon wafer.

10. The process for manufacturing a hybrid timepiece component as claimed in claim 1, wherein the substrate consists of a metal wafer.

11. The process for manufacturing a hybrid timepiece component as claimed in claim 2, comprising:
    forming a second resist layer on top of the first resist mold formed on top of the upper surface of the substrate, the second layer forming at least one positioning pin that enables the subsequent positioning of a structured wafer, a through-opening of which engages with a positioning pin in order to ensure the horizontal holding thereof.

12. The process for manufacturing a hybrid timepiece component as claimed in claim 2, wherein the substrate consists of a silicon wafer comprising a metal layer.

13. The process for manufacturing a hybrid timepiece component as claimed in claim 3, wherein the substrate consists of a silicon wafer comprising a metal layer.

14. The process for manufacturing a hybrid timepiece component as claimed in claim 11, wherein the substrate consists of a silicon wafer comprising a metal layer.

* * * * *